(12) United States Patent
Czubatyj et al.

(10) Patent No.: US 8,344,350 B2
(45) Date of Patent: Jan. 1, 2013

(54) PHASE CHANGE DEVICE WITH OFFSET CONTACT

(75) Inventors: Wolodymyr Czubatyj, Warren, MI (US); Tyler Lowrey, West Augusta, VA (US)

(73) Assignee: Ovonyx, Inc., Sterling Heights, MI (US)

( * ) Notice: Subject to any disclaimer, the term of this patent is extended or adjusted under 35 U.S.C. 154(b) by 0 days.

(21) Appl. No.: 13/093,109

(22) Filed: Apr. 25, 2011

(65) Prior Publication Data

US 2011/0194340 A1  Aug. 11, 2011

(51) Int. Cl.
*H01L 21/06* (2006.01)
*H01L 45/00* (2006.01)

(52) U.S. Cl. ..... 257/4; 438/129; 438/102; 257/E21.645; 257/E31.029

(58) Field of Classification Search ....... 257/4, E21.645, 257/E31.029; 438/102, 129
See application file for complete search history.

(56) References Cited

U.S. PATENT DOCUMENTS

| | | | |
|---|---|---|---|
| 2003/0214856 A1* | 11/2003 | Pellizzer et al. | 365/200 |
| 2004/0178401 A1* | 9/2004 | Ovshinsky et al. | 257/2 |
| 2005/0185444 A1* | 8/2005 | Yang et al. | 365/148 |

* cited by examiner

*Primary Examiner* — Steven J Fulk
(74) *Attorney, Agent, or Firm* — Kevin L. Bray (57) ABSTRACT

A programmable resistance memory combines multiple cells into a block that includes one or more shared electrodes. The shared electrode configuration provides additional thermal isolation for the active region of each memory cell, thereby reducing the current required to program each memory cell.

14 Claims, 6 Drawing Sheets

PHASE CHANGE DEVICE WITH OFFSET CONTACT

FIELD OF INVENTION

This invention pertains to phase change memories. More particularly, this invention relates to reducing the current required to access a phase change memory.

BACKGROUND OF THE INVENTION

Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity varies by two or more orders of magnitude when the material passes from the amorphous (more resistive) phase to the crystalline (more conductive) phase, and vice versa. In the amorphous state, moreover, the resistivity depends to a marked extent upon the temperature.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then cool it off rapidly, i.e. quench. From the electrical standpoint, it is possible to reach the crystallization and melting temperatures by causing a current to flow through a crystalline resistive element that heats the chalogenic material by the Joule effect.

Each memory state of a chalcogenide memory material corresponds to a distinct resistance value and each memory resistance value signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristic of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in Science News, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process: a chalcogenide nitride, or oxide, for example and chalcogenide may be modified by an ion implantation or other process.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Phase change memories provide the benefits of non-volatility, lengthy data retention, and extended cycle life. Further benefits may be realized with a reduction in the current required to write or program a phase change memory. Reducing the programming current required for writing a phase change memory, particularly in programming to the reset state, may permit a reduction in the size of devices used to access a phase change memory and may reduce the overall power consumption of such a device. A phase change memory that requires lower reset programming current would therefore be highly desirable.

SUMMARY OF THE INVENTION

A system and method in accordance with the principles of the present invention employs programmable resistance memory material and a plurality of electrodes coupled to the programmable resistance memory material, the combination configured to operate as a programmable resistance memory. Each memory unit includes a plurality of cells and at least one cell includes offset electrodes. By employing an offset electrode, memory cells in accordance with the principles of the present invention reduce heat loss, thereby making more efficient use of reset programming currents. The more efficient use of reset programming currents, in turn, provides for the use of more compact access devices and lower power operation.

In an illustrative embodiment, a phase change memory cell in accordance with the principles of the present invention includes a top electrode, bottom electrode, and phase change material situated between the top and bottom electrodes, with both electrodes coupled to the phase change material. The top and bottom electrodes are offset from one another. That is, the top electrode is not located directly above the bottom electrode. In an illustrative embodiment, no portion of the top electrode is located directly above any portion of the bottom electrode. Offsetting the electrodes in this manner improves the thermal performance of a programmable resistance memory cell in accordance with the principles of the present invention. In particular, the offset electrode operates to extend the region between top and bottom electrodes and to thereby introduce an inactive region in the path between the bottom electrode, the phase change material's active region and the top electrode. The inactive region, a region of crystalline phase change material, provides a low resistance electrical path between the top and bottom electrodes and, at the same time, provides thermal insulation in that path, thereby allowing for reduced-power operation.

In an illustrative embodiment, a phase change memory in accordance with the principles of the present invention employs three electrodes coupled to one layer of phase change material to form two memory cells. The three-electrode/phase-change layer combination is configured as two memory cells having one offset electrode. The offset electrode will also be referred to herein as a virtual electrode. In this illustrative embodiment two electrodes are formed in-line beneath, and electrically coupled to, a layer of chalcogenide material. A third electrode is formed on top of, and electrically coupled to, the layer of chalcogenide material. In this illustrative embodiment, the third, top, electrode is approximately equidistant from the bottom electrodes and in-line with them. An active region of phase transformation within the phase-change material is associated with each cell and, in particular, in this illustrative embodiment the active region of a cell extends generally from the bottom electrode toward the top, offset, electrode. However, the active region does not reach the top electrode and, as a result, there is a region of chalcogenide between the top electrode and bottom electrode that does not undergo phase transformation during operation of the memory cells. In accordance with the principles of the present invention, this region remains in a crystalline state, thereby providing a highly conductive path between the offset electrode and each cell's active region.

In accordance with the principles of the present invention, the phase-change material layer may be fashioned in any of a number of configurations, such as a purely planar configuration, or a configuration, such as a pore configuration, that includes "confined" chalcogenide material. Confined configurations are designed to reduce the active area of a memory cell and to thereby reduce the current required to program the reset state of a cell.

Offset-electrode phase change memory cells in accordance with the principles of the present invention may be organized in hierarchical arrays with row and column bit lines used to provide access current to the cells. In accordance with the principles of the present invention, the offset electrodes of the memory cells may be coupled to either row or column bit lines. Each unit of memory cells that share an electrode may be electrically isolated from the other units of memory cells within the array in order to prevent inadvertent accesses to surrounding memory units. Also, the lower electrodes of the two memory cells within the offset electrode configuration are isolated from one another to insure unique addressability to each cell.

In accordance with the principles of the present invention, any number of offset top and bottom electrodes may be associated with one another to form a group of programmable resistance memory cells having improved thermal resistance characteristics. For example, in illustrative embodiments, one top electrode, offset from bottom electrode(s) may be associated with from one to sixteen bottom electrodes in a group of programmable resistance memory cells. Or, one to sixteen top electrodes may be offset from and associated with one bottom electrode in a programmable resistance memory group. Or, one to sixteen top electrodes may be offset from and associated with one to sixteen bottom electrodes in a programmable resistance memory group.

In accordance with the principles of the present invention, top and bottom electrodes are offset from one another in order to improve a programmable resistance memory's thermal performance. The absolute and relative number of electrodes, top or bottom, and the interconnection to row or column interconnect conductors may be varied according to design constraints.

Programmable resistance memories in accordance with the principles of the present invention may be particularly suitable for operation in a variety of electronic devices, including cellular telephones, radio frequency identification devices (RFID), computers (portable and otherwise), location devices (e.g., global positioning system (GPS) devices, particularly those that store and update location-specific information), and handheld electronic devices, including personal digital assistants (PDAs), and entertainment devices, such as MP3 players, for example.

DETAILED DESCRIPTION

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Binary memory cell operation is a special case of multi-level operation. For the sake of clarity and brevity of description, the following discussion will be generally in terms of a phase-change implementation, but other programmable resistance implementations are also within the scope of the invention. The terms top and bottom, row and column, x-direction and y-direction are used for illustrative purposes and, typically, may be interchanged. Features are not drawn to scale. Row and column interconnect lines may be larger than electrodes, but, for clarity of description, interconnect lines are generally illustrated as having smaller feature sizes than electrodes. Accordingly, the scope of the invention is defined only by reference to the appended claims.

Figure 1A:
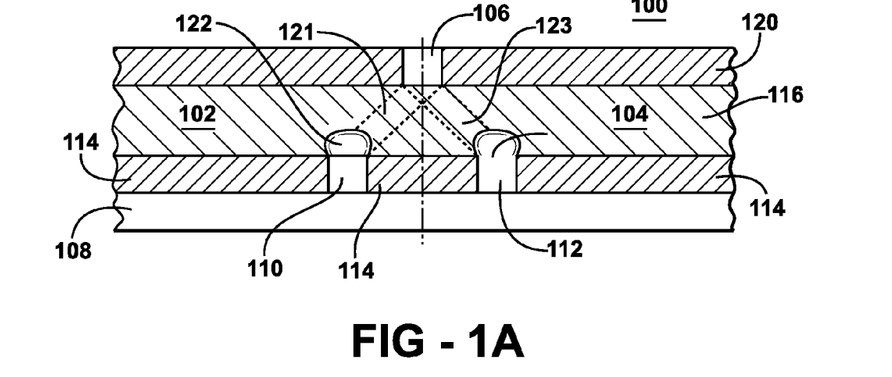
FIGS. 1A through 1L are sectional and top plan views of offset-electrode programmable resistance memory in accordance with the principles of the present invention.
Figure 1B:
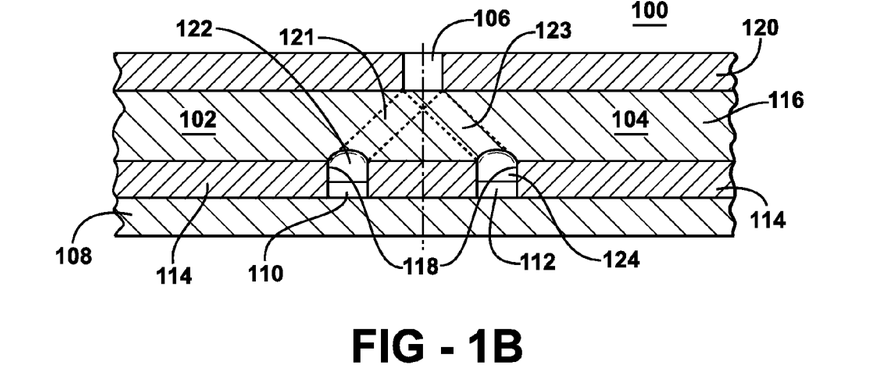

FIGS. 1A and 1B provide sectional views, respectively, of planar and confined-cell embodiments of virtual, or offset, electrode programmable resistance memory cells 100 in accordance with the principles of the present invention. In this illustrative embodiment, the memory 100 includes two cells 102, 104 that share a top electrode 106. By sharing an electrode, memory cells in accordance with the principles of the present invention reduce heat loss, thereby making more efficient use of programming currents. The more efficient use of programming currents, in turn, provides for the use of more compact access devices and lower-power operation. In an illustrative embodiment the top electrode employs Ti and/or TiN.

The illustrative memory cells 102, 104 are formed on a substrate 108 that may include access devices, such as transistors, diodes, two-terminal OTS, or three-terminal OTS devices, for example. The access devices (not shown) are coupled to respective bottom electrodes 110,112 of memory cells 102,104. As will be described in greater detail in the discussion related to FIG. 3, the access devices, in turn, are coupled to conductive lines (for example, row lines or column lines) controlled by decoded addresses that select a specific memory cell within an array.

In the illustrative embodiment of FIG. 1A, bottom electrodes 110, 112 are formed in a dielectric layer 114 and have a planar layer of phase change material 116 deposited on top of them. In FIG. 1B the layer of phase change material 116 includes pore-filling regions 118. A dielectric layer 120 is formed over the layer of phase change material 116 and the offset electrode 106 is formed therein. The memory cells 102,104 include respective active regions 122,124: regions that undergo phase change during write operations. The memory cells 102,104 also include respective inactive regions 121,123. In an illustrative embodiment the inactive regions are regions of crystalline phase change material that do not undergo phase change and are electrically conductive.

In an illustrative embodiment, the top electrode 106 is equidistant from the bottom electrodes 110,112 and the distance between electrodes 106 and 110 (or 112) is 0.15 nm. The resistance associated with each of the inactive regions is approximately 500 ohms, for example. Although the inactive regions 121,123 provide conductive paths between the active region of a cell and the offset electrode, the crystalline material within the regions is a relatively good thermal insulator and, therefore, reduces heat loss from a memory cell's active region compared to heat loss that would be incurred with a conductive electrode in close proximity to the active region, such as is used with conventional memory cells. In order to ensure that the active region is in proximity to the bottom electrodes 110,112, a resistive layer may be introduced or a resistive bottom electrode, often referred to as a "heater" may be employed. The bottom electrodes 110,112 may employ conventional "heater" materials, such as TiSiN or TiN, for example, and may be used in combination with insulator materials, such as $SiO_2$ or $Al_2O_3$, for example.

In order to provide a clearer view of features of offset-electrode programmable resistance memories in accordance with the principles of the present invention, some reference numerals have been left out of some of the following Figures, particularly those number referring to features (for example, a top electrode 106) that appear repeatedly in the Figures and would tend to clutter the Figure.

Figure 1C:
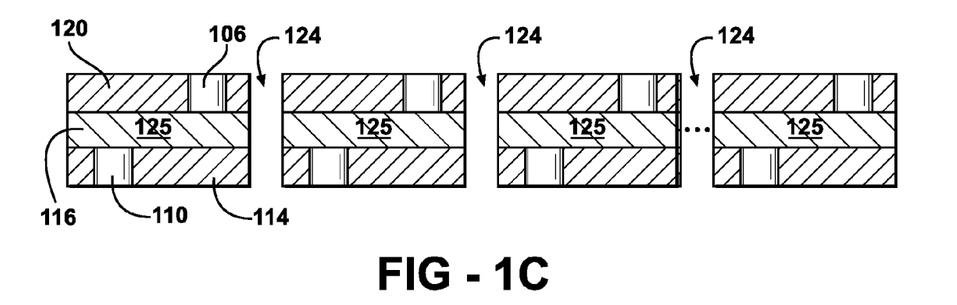
Figure 1D:
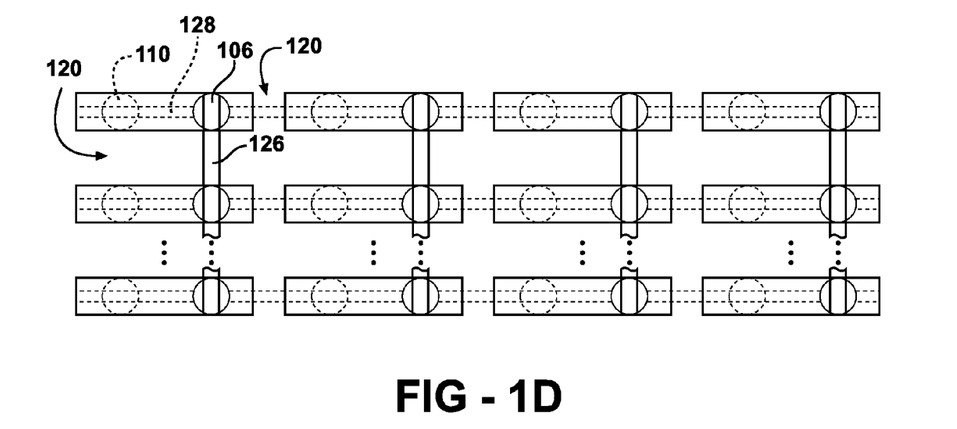

The sectional and top plan views of FIGS. 1C and 1D, respectively, illustrate a single-electrode embodiment of an offset-electrode programmable resistance memory in accordance with the principles of the present invention. In this illustrative embodiment, each memory cell 122 includes a top electrode 106, a bottom electrode 110, a bottom dielectric layer 114, a layer of phase change material 116, and a top dielectric layer 120. As with the illustrative embodiments of FIGS. 1A and 1B, in accordance with the principles of the present invention, the top 106 and bottom 110 electrodes are offset from one another in order to reduce heat loss by using regions of crystalline phase change material to thermally insulate the active region of phase change material, as described in greater detail in the discussion related to FIGS. 1A and 1B. Dielectric regions 120 separate individual cells from one another. Column interconnect 126 and row interconnect 128 are depicted in the top plan view of FIG. 1D. As described in greater detail in the discussion related to FIG. 3, row and column access devices may be employed to drive the row 128 and column 126 interconnect in a manner that thereby selects a specific one of the cells 122. Programmable resistance memory having offset electrodes in accordance with the principles of the present invention may be organized in blocks, for convenient addressing or for isolation purposes for example. In accordance with the principles of the present invention, such blocks may include, one cell, two cells, eight cells, sixteen cells, thirty-two cells, or sixty-four cells, for example. In addition to including offset electrodes, one or more cells within a block of memory cells in accordance with the principles of the present invention may share an electrode. By offset electrode, we mean electrodes that are positioned to lengthen the conduction path through an intervening phase change material when compared with the path associated with a configuration in which one electrode is positioned directly above another.

Figure 1E:
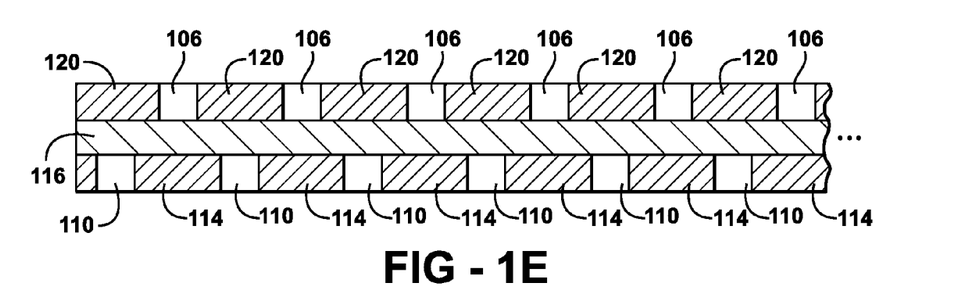
Figure 1F:
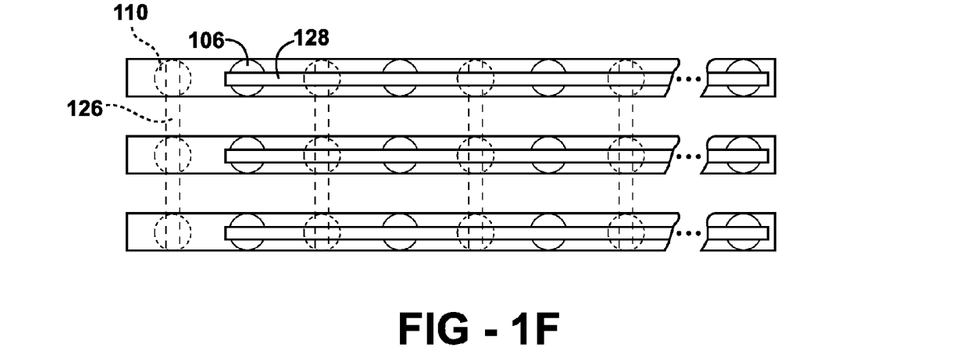

In the illustrative embodiment of FIGS. 1E and 1F, top electrodes 106 and bottom electrodes 110 are offset from one another in order to reduce heat loss by employing regions of crystalline phase change material to thermally insulate the active region of phase change material in accordance with the principles of the present invention. In this illustrative embodiment, there may be a one-to-one matching of top 106 and bottom 110 electrodes, resulting in an equal number of top 106 and bottom 110 electrodes. Alternatively, one or more electrodes, particularly at either end of a group of cells, may be shared, with corresponding accommodation made on row and/or column interconnect lines.

The top plan view of FIG. 1F provides a view of an illustrative embodiment of an interconnect layout suitable for use with an offset memory cell group, such as described in the discussion related to FIG. 1E. In this illustrative embodiment, column interconnect 126 lines are coupled to bottom electrodes 110 and row interconnect lines 128 are coupled to top electrodes 106. As described in greater detail in the discussion related to FIG. 3, row and column access devices may be employed to drive the row 128 and column 126 interconnect conductors in a manner that thereby selects a specific one of the cells 122. For example, when all top electrodes in a group are brought to the same electrical potential by a row selection device driving a row interconnect line 128, one of the cells within the group may be selected by driving a column interconnect line 126 to an electrical potential that, in combination with the potential of the row interconnect line, is sufficient to access a memory element defined by the combination of the selected row and column.

Figure 1G:
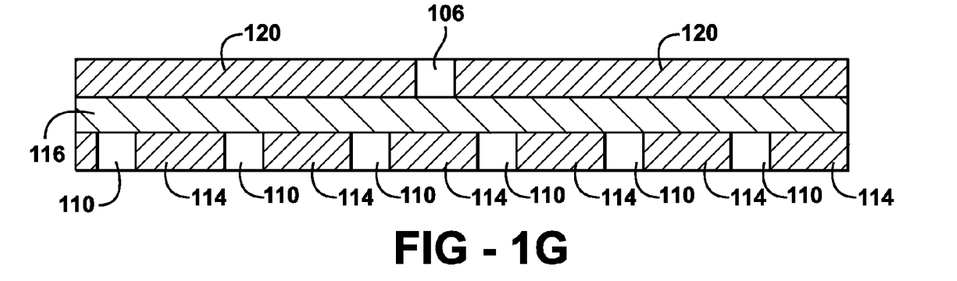
Figure 1H:
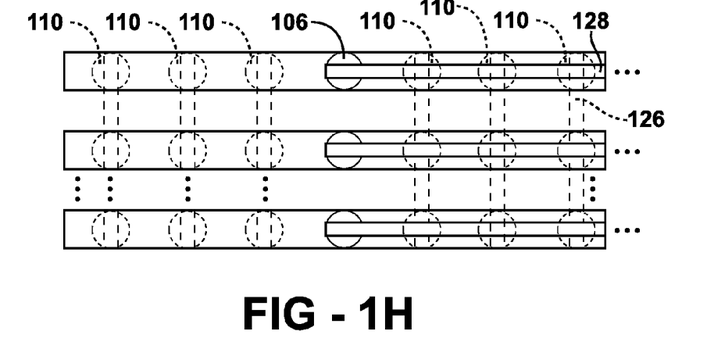

In the illustrative embodiment of FIGS. 1G and 1H, top electrodes 106 and bottom electrodes 110 are offset from one another in order to reduce heat loss by employing regions of crystalline phase change material to thermally insulate the active region of phase change material in accordance with the principles of the present invention. In this illustrative embodiment, there is a one-to-plurality matching of top 106 and bottom 110 electrodes, resulting in an unequal number of top 106 and bottom 110 electrodes. The one-top/two-bottom electrode configuration described in the discussion related to FIGS. 1A and 1B are specific cases of a one-to-plurality offset electrode programmable resistance memory in accordance with the principles of the present invention. In this illustrative embodiment one top electrode 106 provides a row access signal for six bottom electrodes 110 in a memory cell group. No bottom electrodes 110 are directly below the top electrode 106.

The top plan view of FIG. 1H provides a view of an illustrative embodiment of an interconnect layout suitable for use with an offset memory cell group, such as described in the discussion related to FIG. 1G. In this illustrative embodiment, column interconnect 126 lines are coupled to bottom electrodes 110 and row interconnect lines 128 are coupled to a single top electrode 106 within a group of cells. As described in greater detail in the discussion related to FIG. 3, row and column access devices may be employed to drive the row 128 and column 126 interconnect conductors in a manner that thereby selects a specific one of the cells 122.

Figure 1I:
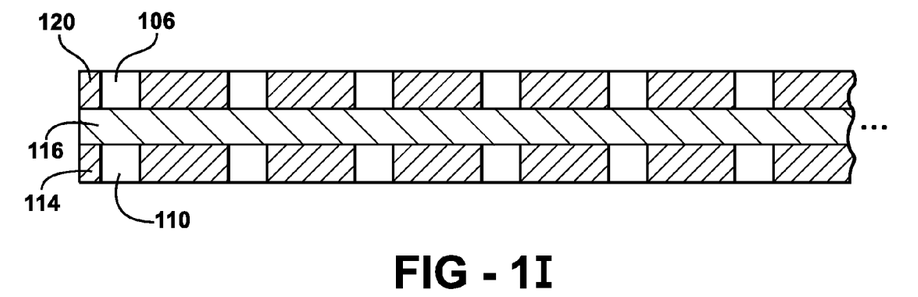
Figure 1J:
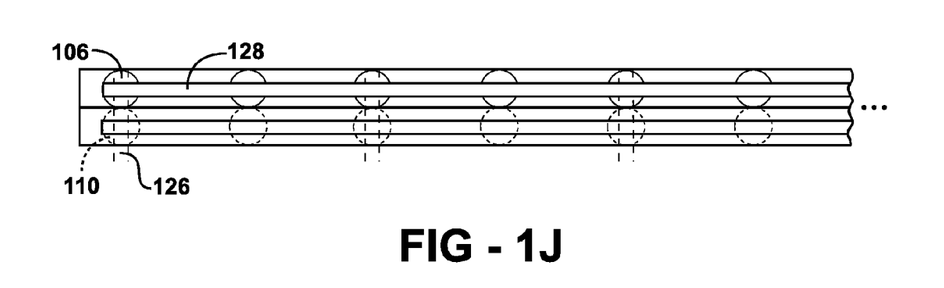

In the illustrative embodiment of FIGS. 1I and 1J, top electrodes 106 and bottom electrodes 110 are offset from one another in order to reduce heat loss by employing regions of crystalline phase change material to thermally insulate the active region of phase change material in accordance with the principles of the present invention. In this illustrative embodiment, the offset between top and bottom electrodes is in a direction orthogonal to the offset direction of previously discussed illustrative embodiments. For convenience, we will use the term "Z direction" to refer to the direction of this offset and "X direction" to refer to the direction of previously described offsets. The top plan view of FIG. 1J more clearly illustrates this z direction offset; none of the top electrodes 106 are directly above the bottom electrodes 110. Row 128 and column 126 interconnect operate as previously described. Although illustrated with a one-to-one correspondence between top and bottom electrodes, embodiments with a greater number of top electrodes than bottom electrodes or with a greater number of bottom electrodes than top electrodes are contemplated within the scope of the invention.

Figure 1K:
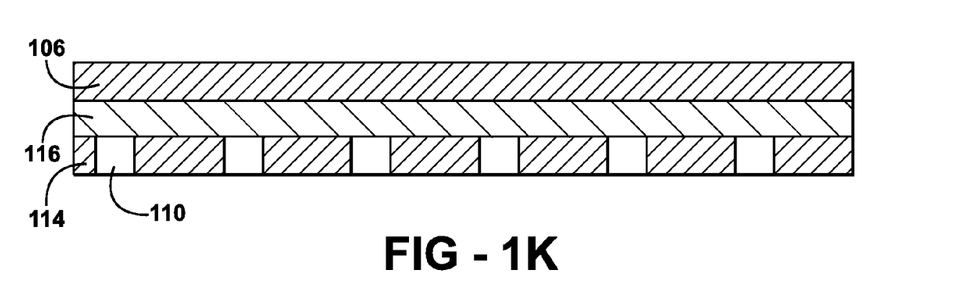
Figure 1L:
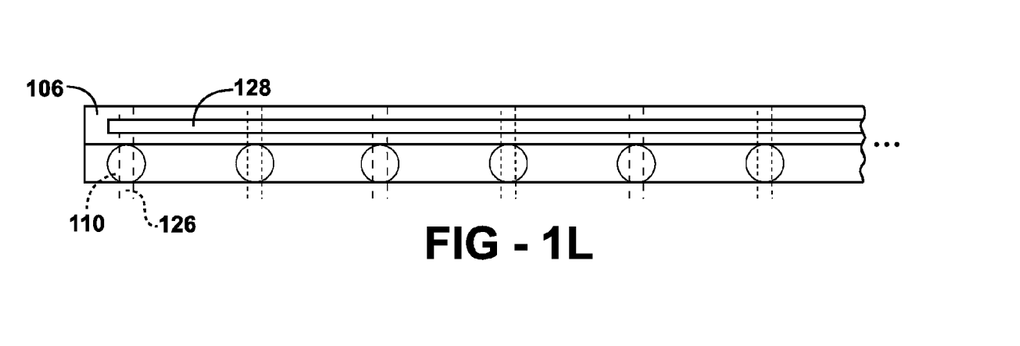

In the illustrative embodiment of FIGS. 1K and 1L, a top electrode 106 and bottom electrodes 110 are offset from one another in order to reduce heat loss by employing regions of crystalline phase change material to thermally insulate the active region of phase change material in accordance with the principles of the present invention. In this illustrative embodiment, the offset between top and bottom electrodes is in the same, "Z" direction, as described in the discussion related to FIGS. 1I and 1J. The top plan view of FIG. 1L more clearly illustrates this z direction offset; no portion of the top electrode 106 lies directly above the bottom electrodes 110. Row 128 and column 126 interconnect operate as previously described.

In accordance with the principles of the present invention, any number of offset top and bottom electrodes may be associated with one another to form a group of programmable resistance memory cells with improved thermal resistance characteristics. For example, in illustrative embodiments, one top electrode, offset from bottom electrode(s), may be associated with from one to sixteen bottom electrodes in a group of programmable resistance memory cells. Or, one to sixteen top electrodes may be offset from and associated with one bottom electrode in a programmable resistance memory group. Or, one to sixteen top electrodes may be offset from and associated with one to sixteen bottom electrodes in a programmable resistance memory group. In accordance with the principles of the present invention, top and bottom electrodes are offset from one another in order to improve a programmable resistance memory's thermal performance. The absolute and relative number of electrodes, top or bottom, and the interconnection to row or column interconnect conductors may be varied according to design constraints.

Figure 2:
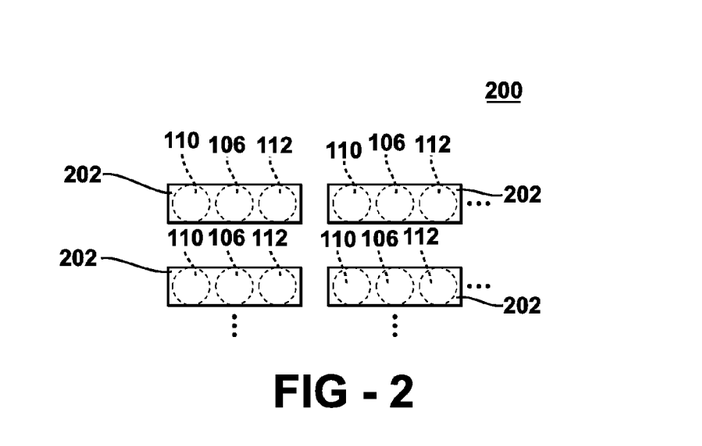
FIG. 2 is a top plan view of an array of offset-electrode programmable resistance memories in accordance with the principles of the present invention.

The top plan view of FIG. 2 provides an illustration of a segment of an array 200 of offset electrode programmable resistance memory cells in accordance with the principles of the present invention. In this illustrative embodiment pairs 202 of cells include two bottom electrodes 110,112 and one, shared, top electrode 106. Each memory cell pair 202 is electrically isolated from the other memory cell pairs 202. This electrical isolation may be implemented, for example, by enclosing the memory cell pairs 202 within a dielectric layer. Individual cells within a memory cell pair may be accessed sequentially, but not in parallel. That is, for example, if the offset electrode of a memory cell pair is connected to a horizontal line that drives the top row of the cell array shown in FIG. 2 and the separate electrodes are connected individually to lines that drive columns 1 and 2 of the cells' array, in order to prevent ambiguous accesses, the column 1 and 2 access lines are not asserted simultaneously and, as a result, the associated memory cells are able to be read or written uniquely. Because, as will be described in greater detail in the discussion related to FIG. 3, a memory may be organized into a hierarchical array, cells within different blocks within an array may be accessed simultaneously, thereby providing parallel access to memory cells, even if not to memory cells within the same pair.

Offset-electrode phase change memory cells in accordance with the principles of the present invention may be organized in hierarchical arrays with row and column bit lines used to provide access current to the cells. In accordance with the principles of the present invention, the offset electrodes of the memory cells may be connected to either row or column bit lines. Each unit (for example, two-cell pair) of memory cells that share an electrode is electrically isolated from the other units of memory cells within the array in order to prevent inadvertent accesses to surrounding memory units. In accordance with the principles of the present invention, each memory cell may be operated as either binary or multi-level storage (MLC) memory.

Decoded addresses, in combination with signals such as READ, SET, and RESET, may be employed to route the appropriate current source to a selected memory cell. In the conceptual block diagram of FIG. 3 a memory in accordance with the principles of the present invention 300 is organized in an 8×8 array of 64 memory blocks 302. Each block includes an array of offset-electrode memory cells 304 and peripheral circuitry that includes column 306, and row 308 access circuitry that provide access to individual memory cells 310 within each block 302. Peripheral array circuitry 312 includes row and column decoders and drivers, data and address buffers, sense amplifiers and current sources. The peripheral array circuitry 312 provides top-level decoding for access to the memory blocks 302, and enables the appropriate read- or write-buffers, sense amplifiers, and current sources into a selected memory block 302.

Figure 3:
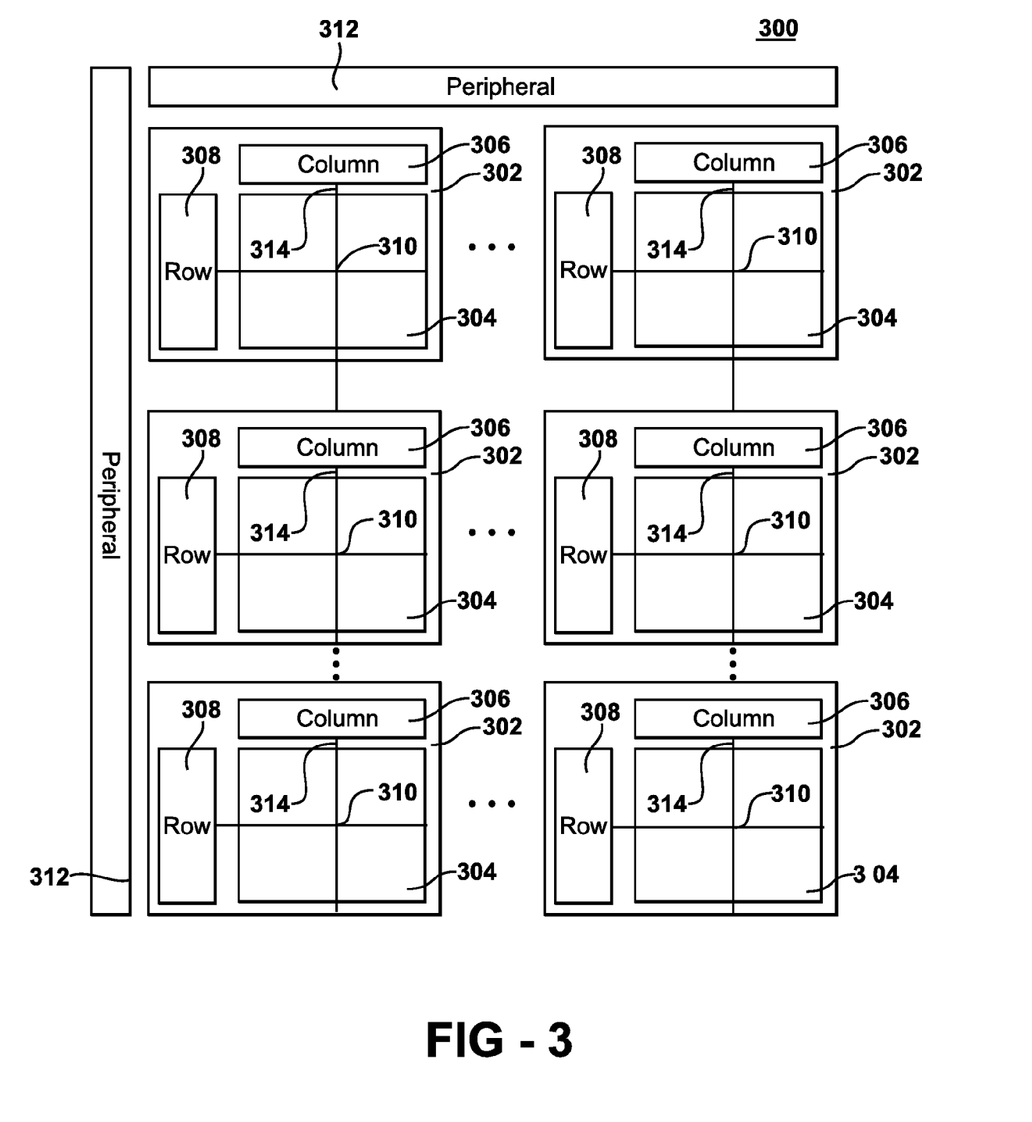
FIG. 3 is a schematic diagram of a hierarchical array of offset-electrode programmable resistance memories in accordance with the principles of the present invention.

Within each block of memory, ADDRESS DECODE, READ, SET, and RESET signals are used to determine which cell to access and which operation to perform on the accessed cell. In this illustrative embodiment, the memory employs different current/voltage sources for each operation, and, therefore, it predetermines not just whether a selected cell is to be read from or written to, but, additionally, if it is being written to, whether a SET or RESET (or other-level storage in an MLC implementation) is to be performed. In an illustrative embodiment, the offset electrodes of the memory cells within the memory blocks are coupled to the row access circuitry 308 and the non-offset electrodes are coupled to column access circuitry 306. In another illustrative embodiment, the offset electrodes of the memory cells within the memory blocks are coupled to column access circuitry 306 and the non-offset electrodes are coupled to row access circuitry 308.

Programmable resistance memories in accordance with the principles of the present invention may be particularly suitable for operation in a variety of electronic devices, including cellular telephones, radio frequency identification devices (RFID), computers (portable and otherwise), location devices (e.g., global positioning system (GPS) devices, particularly those that store and update location-specific information), and handheld electronic devices, including personal digital assistants (PDAs), and entertainment devices, such as MP3 players, for example.

Figure 4:
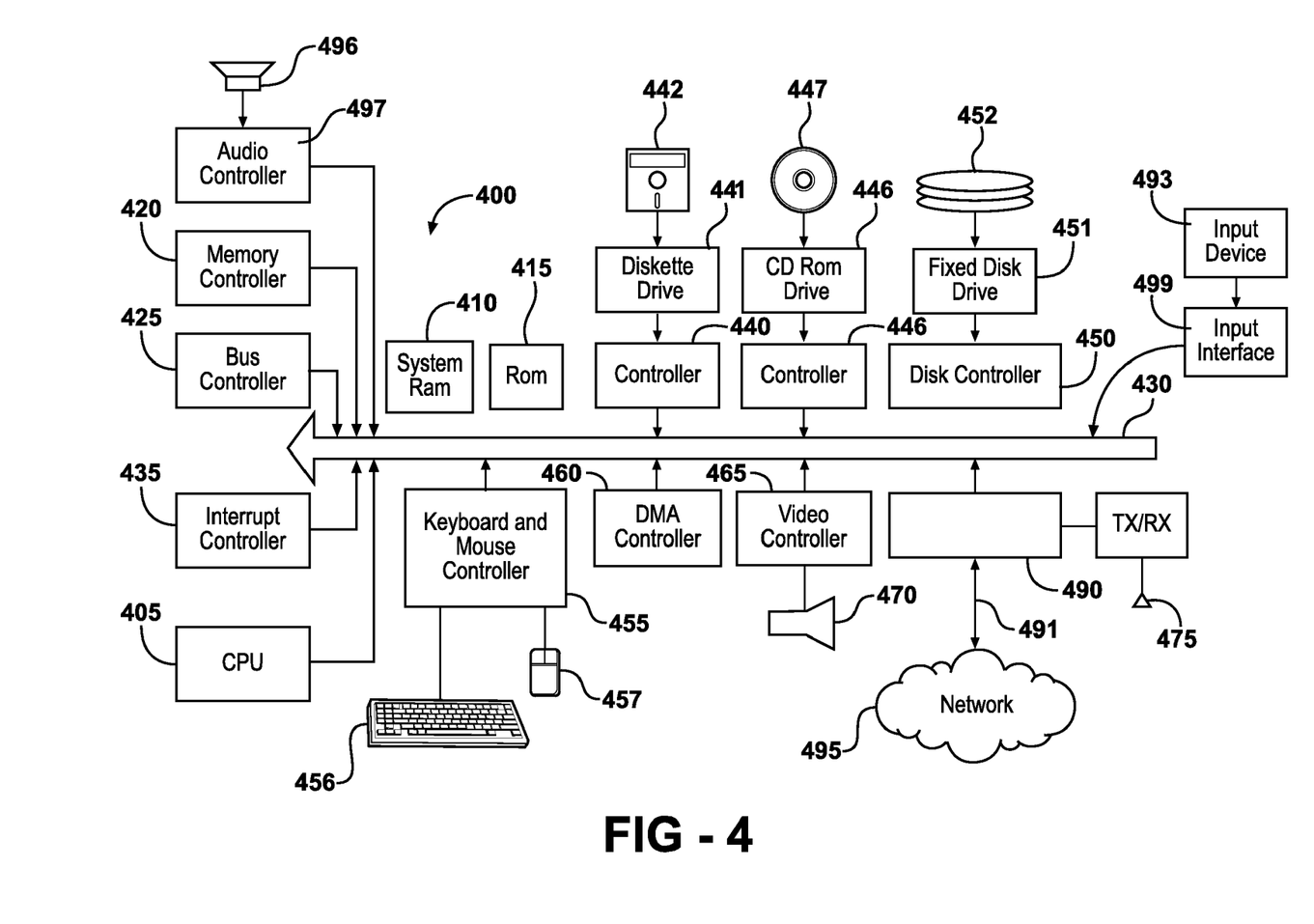
FIG. 4 is a conceptual block diagram of an electronic device that employs a phase change memory in accordance with the principles of the present invention.

The schematic diagram of FIG. 4 will be employed to illustrate the devices' use in a few such systems. The schematic diagram of FIG. 4 includes many components and devices, some of which will be used for specific embodiments of a system in accordance with the principles of the present invention and others not. In other embodiments, other similar systems, components and devices may be employed. In general, the system includes logic circuitry configured to operate along with phase change memory. The logic circuitry may be discrete, programmable, application-specific, or in the form of a microprocessor, for example. And the embodiments herein may also be employed within the chips or connected to such circuitry.

The exemplary system of FIG. 4 is for descriptive purposes only. Although the description may refer to terms commonly used in describing particular computer, communications, tracking, and entertainment systems, the description and concepts equally apply to other systems, including systems having architectures dissimilar to that illustrated in FIG. 4. The electronic system 400, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, or a radio frequency identification device. Any or all of the components depicted in FIG. 4 may employ a phase change memory or chalcogenide electronic device, such as a chalcogenide-based nonvolatile memory or threshold switch, for example.

In an illustrative embodiment, the system 400 may include a central processing unit (CPU) 405, which may be implemented with some or all of a microprocessor, a random access memory (RAM) 410 for temporary storage of information, and a read only memory (ROM) 415 for permanent storage of information. A memory controller 420 is provided for controlling RAM 410. In accordance with the principles of the present invention, all of, or any portion of, any of the memory elements (e.g. RAM or ROM) may be implemented as chalcogenide-based nonvolatile memory.

An electronic system 400 in accordance with the principles of the present invention may be a microprocessor that operates as a CPU 405, in combination with embedded chalcogenide-based electronic nonvolatile memory that operates as RAM 410 and/or ROM 415, or as a portion thereof. In this illustrative example, the microprocessor/chalcogenide-nonvolatile memory combination may be standalone, or may operate with other components, such as those of FIG. 4 yet-to-be described.

In implementations within the scope of the invention, a bus 430 interconnects the components of the system 400. A bus controller 425 is provided for controlling bus 430. An interrupt controller 435 may or may not be used for receiving and processing various interrupt signals from the system components. Such components as the bus 430, bus controller 425, and interrupt controller 435 may be employed in a large-scale implementation of a system in accordance with the principles of the present invention, such as that of a standalone computer, a router, a portable computer, or a data storage system, for example.

Mass storage may be provided by diskette 442, CD ROM 447, or hard drive 452. Data and software may be exchanged with the system 400 via removable media such as diskette 442 and CD ROM 447. Diskette 442 is insertable into diskette drive 441 which is, in turn, connected to bus 430 by a controller 440. Similarly, CD ROM 447 is insertable into CD ROM drive 446 which is, in turn, connected to bus 430 by controller 445. Hard disc 452 is part of a fixed disc drive 451 which is connected to bus 430 by controller 450. Although conventional terms for storage devices (e.g., diskette) are being employed in this description of a system in accordance with the principles of the present invention, any or all of the storage devices may be implemented using chalcogenide-based nonvolatile memory in accordance with the principles of the present invention. Removable storage may be provided by a nonvolatile storage component, such as a thumb drive, that employs a chalcogenide-based nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing storage media such as diskette, CD ROM, or hard disk to provide a transparent interface for controllers such as controllers 440, 445, and 450, for example.

User input to the system 400 may be provided by any of a number of devices. For example, a keyboard 456 and mouse 457 are connected to bus 430 by controller 455. An audio transducer 496, which may act as both a microphone and a speaker, is connected to bus 430 by audio controller 497, as illustrated. Other input devices, such as a pen and/or tabloid may be connected to bus 430 and an appropriate controller and software, as required, for use as input devices. DMA controller 460 is provided for performing direct memory access to RAM 410, which, as previously described, may be implemented in whole or part using chalcogenide-based nonvolatile memory devices in accordance with the principles of the present invention. A visual display is generated by video controller 465 which controls display 470. The display 470 may be of any size or technology appropriate for a given application.

In a cellular telephone or portable entertainment system embodiment, for example, the display 470 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 400 may also include a communications adaptor 490 which allows the system to be interconnected to a local area network (LAN) or a wide area network (WAN), schematically illustrated by bus 491 and network 495. An input interface 499, not shown in FIG. 4, operates in conjunction with an input device 493, not shown in FIG. 4, to permit a user to send information, whether command and control, data, or other types of information, to the system 400. The input device and interface may be any of a number of common interface devices, such as a joystick, a touch-pad, a touch-screen, a speech-recognition device, or other known input device. In some embodiments of a system in accordance with the principles of the present invention, the adapter 490 may operate with transceiver 473 and antenna 475 to provide wireless communications, for example, in cellular telephone, RFID, and wifi computer implementations.

Operation of system 400 is generally controlled and coordinated by operating system software. The operating system controls allocation of system resources and performs tasks such as processing scheduling, memory management, networking, and I/O services, among things. In particular, an operating system resident in system memory and running on CPU 405 coordinates the operation of the other elements of the system 400.

In illustrative handheld electronic device embodiments of a system 400 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 455, keyboard 456 and mouse 457, for example. Embodiments with a transmitter, recording capability, etc., may also include a microphone input (not shown).

In an illustrative RFID transponder implementation of a system 400 in accordance with the principles of the present invention, the antenna 475 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 473 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 473 as an "answerback" signal on the antenna 475 at a second carrier frequency $F_2$. In passive RFID systems, power is derived from the interrogating signal and memory such as provided by a chalcogenide-based nonvolatile memory in accordance with the principles of the present invention is particularly well suited to such use.

We claim:

1. An apparatus, comprising:
an array of programmable resistance memory cells arranged in a grid, said grid having a grid location, said grid location including more than two of said memory cells, said more than two memory cells including a plurality of electrodes, said plurality of electrodes including:
a first electrode beneath and electrically coupled to a layer of programmable resistance material;
a second electrode above and electrically coupled to said layer of programmable resistance material; and
a third electrode beneath and electrically coupled to said layer of programmable resistance material, wherein none of the first, second, and third electrodes overlies each other;
wherein less than or equal to 16 of said more than two memory cells at said grid location share at least one of said plurality of electrodes and wherein at least two of said plurality of electrodes are independent.

2. The apparatus of claim 1, wherein said second electrode is equidistant from said first and third electrodes.

3. The apparatus of claim 2, wherein said first, second and third electrodes are in-line.

4. The apparatus of claim 2, wherein said programmable resistance material includes chalcogenide material.

5. The apparatus of claim 1, wherein more than three memory cells of said grid location share at least one electrode.

6. The apparatus of claim 1, wherein more than four memory cells of said grid location share at least one electrode.

7. The apparatus of claim 1, wherein more than seven memory cells of said grid location share at least one electrode.

8. The apparatus of claim 1, wherein each of said more than two memory cells includes an electrode not shared with other memory cells.

9. An apparatus, comprising:
an array of programmable resistance memory cells arranged in a grid, said grid having a grid location, said grid location including more than two of said memory cells, said more than two memory cells including a plurality of electrodes, said plurality of electrodes including:
a first electrode beneath and electrically coupled to a layer of programmable resistance material;
a second electrode above and electrically coupled to said layer of programmable resistance material; and
a third electrode beneath and electrically coupled to said layer of programmable resistance material, wherein none of the first, second, and third electrodes overlies each other;
wherein less than or equal to 16 of said more than two memory cells at said grid location share at least one of said plurality of electrodes and wherein at least two of said plurality of electrodes are independent and
electronic circuitry configured to access said array of programmable resistance memory cells.

10. The apparatus of claim 9, wherein said electronic circuitry includes a microprocessor.

11. The apparatus of claim 10, wherein said apparatus is configured to operate as a digital computer.

12. The apparatus of claim 11, wherein said circuitry is configured to operate as a cellular telephone.

13. The apparatus of claim 10, further comprising a transceiver.

14. The apparatus of claim 10, wherein said circuitry is configured to operate as a digital entertainment device.

* * * * *